United States Patent
Sato et al.

(10) Patent No.: US 6,580,074 B1
(45) Date of Patent: Jun. 17, 2003

(54) CHARGED PARTICLE BEAM EMITTING DEVICE

(75) Inventors: Mitsugu Sato, Hitachinaka (JP); Yuko Iwabuchi, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/230,528

(22) PCT Filed: Sep. 24, 1997

(86) PCT No.: PCT/JP97/03385

§ 371 (c)(1),
(2), (4) Date: Jan. 27, 1999

(87) PCT Pub. No.: WO98/13854

PCT Pub. Date: Apr. 2, 1998

(30) Foreign Application Priority Data

Sep. 24, 1996 (JP) .............................. 8-251191

(51) Int. Cl.$^7$ ........................... G01N 23/00; G21K 7/00
(52) U.S. Cl. ................ 250/310; 250/311; 250/396 ML; 250/396 MR
(58) Field of Search ........................ 250/310, 396 MR, 250/311, 396 ML (56) References Cited

U.S. PATENT DOCUMENTS

| | | | | |
|---|---|---|---|---|
| 4,214,162 A | * | 7/1980 | Hoppe et al. | 250/311 |
| 4,219,732 A | * | 8/1980 | Nakagawa et al. | 250/396 ML |
| 4,426,577 A | * | 1/1984 | Koike et al. | 250/310 |
| 4,810,880 A | * | 3/1989 | Gerlach | 250/305 |
| 4,823,005 A | * | 4/1989 | Garth | 250/310 |
| 5,561,299 A | * | 10/1996 | Ishida et al. | 250/442.11 |
| 5,614,833 A | * | 3/1997 | Golladay | 250/310 |
| 5,736,742 A | * | 4/1998 | Ochiai | 250/396 R |
| 5,885,354 A | * | 3/1999 | Frosien et al. | 118/723 FE |
| 6,307,312 B1 | * | 10/2001 | Tanaka | 250/311 |

FOREIGN PATENT DOCUMENTS

JP 06-275224 9/1994 .......... H01J/37/141

* cited by examiner

Primary Examiner—Jack Berman
Assistant Examiner—Kalimah Fernandez
(74) Attorney, Agent, or Firm—Kenyon & Kenyon

(57) ABSTRACT

A charged particle beam irradiator makes it possible to observe an image at a high resolution and preferable contrast while reserving an operating distance of a sample or an area for the installation of a sample stage. The charged particle beam irradiator scans charged particle beams emitted by a charged particle source on a sample and obtains a scanned image of said sample based on charged particles obtained as a result of said scanning and is equipped with an electromagnetic lens having a magnetic pole provided between said sample and said charged particle source and at least a pair of magnetic poles provided under said sample and configured to generate a magnetic field there between. This configuration makes it possible to observe an image at a high resolution and preferable contrast while reserving an operating distance of the sample throughout a wide range of acceleration voltage.

20 Claims, 7 Drawing Sheets

*PRIOR ART*

CHARGED PARTICLE BEAM EMITTING DEVICE

TECHNICAL FIELD

The present invention relates to a charged particle beam irradiator and, more particularly, to a charged particle beam irradiator suitable for obtaining a scanned image of a sample at a high resolution and preferable contrast.

BACKGROUND ART

To obtain a scanned image of a sample at a high resolution especially with a scanning electronic microscope, it has been necessary to make primary electron beams scanned on the sample as narrow as possible. The most popular means for making primary electron beams scanned on a sample narrow is a method wherein the focal length of the objective lens is reduced to reduce the aberration of the lens.

One well known means for achieving a short focal point is an in-lens type electromagnetic lens in which a sample is located between magnetic poles of an objective lens (e.g., that disclosed in Japanese unexamined patent publication No. S62-291849).

DISCLOSURE OF THE INVENTION

However, limitations are placed on an in-lens type electromagnetic lens including a limitation on the moving range of a sample associated with the configuration in which the sample is interposed between the magnetic poles of the lens. For example, while some recent scanning electronic microscopes include a tilted stage in a sample chamber to allow the sample to be observed at an inclination depending on the object of the observation, the movement is limited by the presence of the magnetic poles located above and under the sample. Meanwhile, a sample must be located close to the upper magnetic pole in order to reduce the chromatic aberration coefficient and spherical aberration coefficient and, which is a factor that conversely reduces the area in which the sample is tilted.

Further, even an apparatus in which a sample is moved only in a direction perpendicular to electron beams, a problem arises in that it is limited with regard to the space to install it because of its configuration wherein a moving mechanism thereof is provided in an objective lens.

It is an object of the present invention to solve those problems and to provide a charged particle beam irradiator including an electromagnetic lens with which a small aberration coefficient can be achieved while reserving a sufficient tilting range for samples and a space for installing a sample moving mechanism and the like.

In order to achieve the above-described object, according to the present invention, there is provided a charged particle beam irradiator comprising an electromagnetic lens which includes a magnetic pole provided between a sample and a charged particle source and at least a pair of magnetic poles provided under the sample and which is configured to generate a magnetic field therebetween.

With the above-described configuration, it is possible to converge charged particle beams with a magnetic field generated between the magnetic pole provided between the sample and the charged particle source and the magnetic poles provided under the sample and to limit the spread of the magnetic field distribution of the magnetic field for converging said charged particle beams toward the charged particle source with a magnetic field generated between the at least two magnetic poles provided under the sample.

This can be more specifically described as follows.

Figure 2:
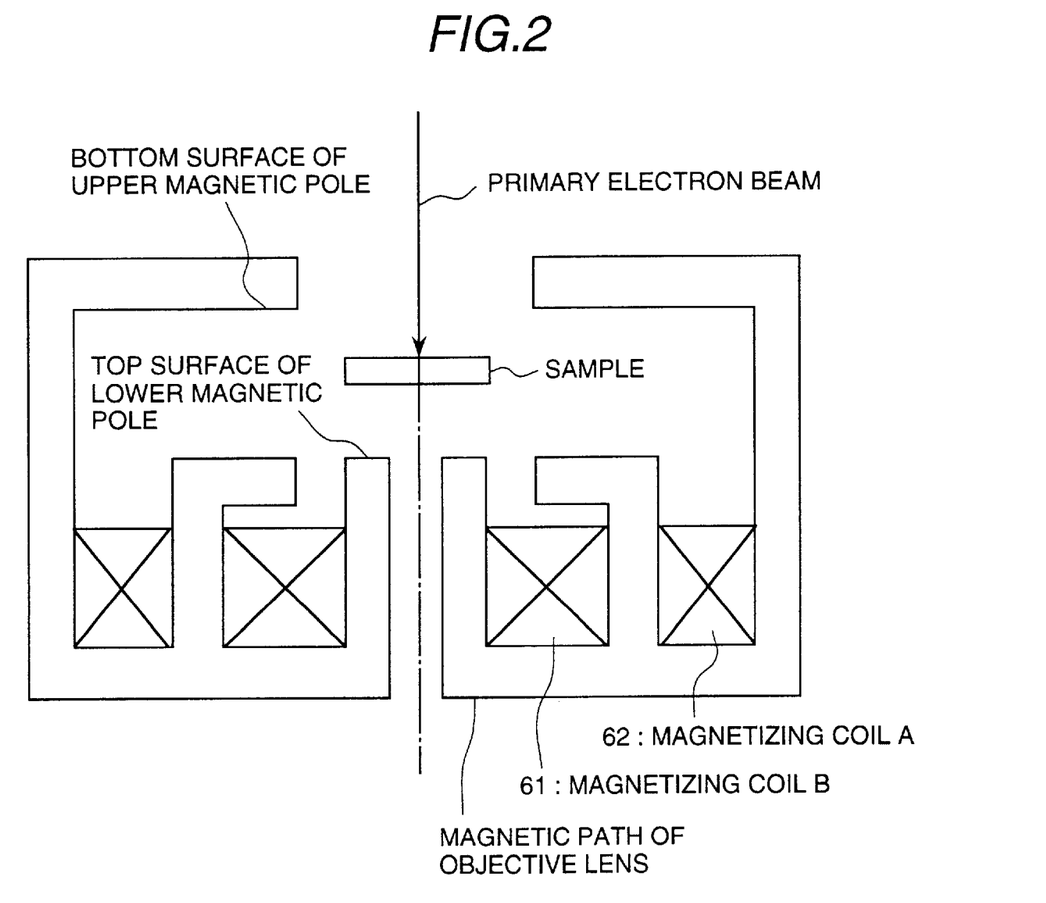
FIG. 2 shows a configuration of the objective lens shown in FIG. 1.
Figure 3:
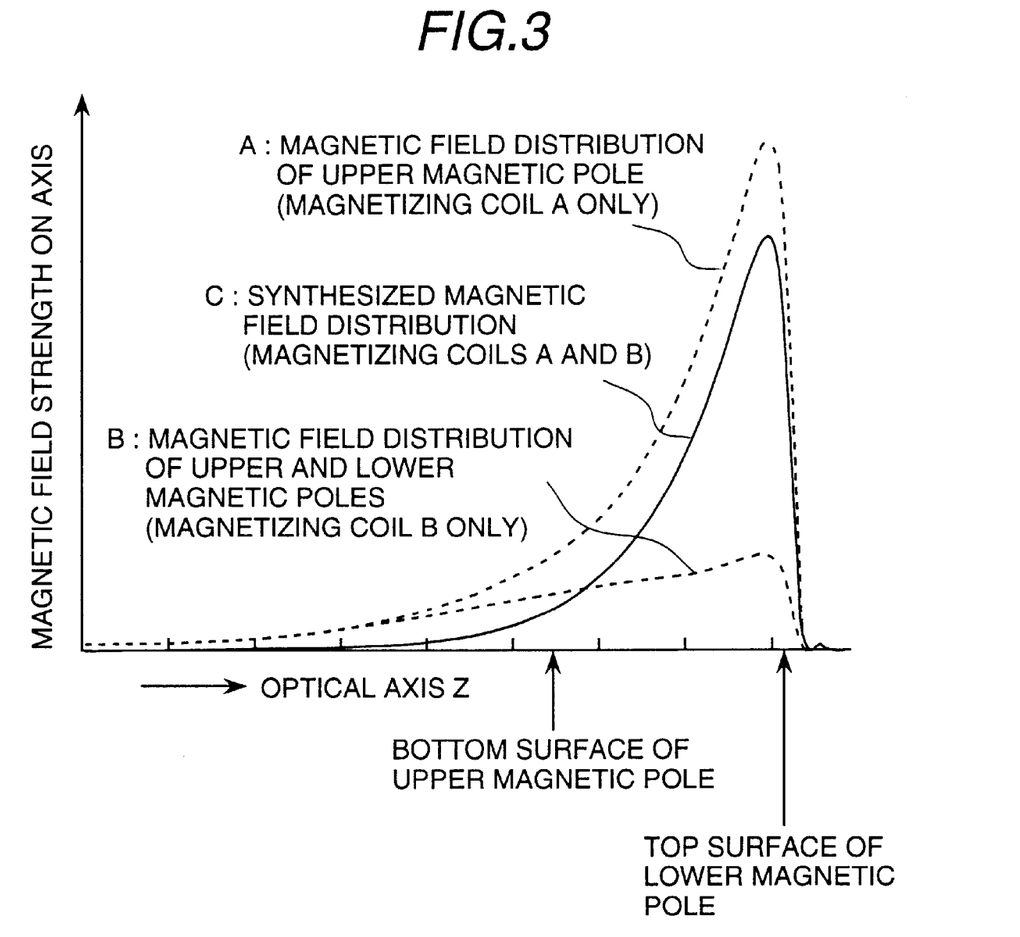
FIG. 3 illustrates the distribution of a lens magnetic field generated between magnetic poles of the objective lens.

Referring to FIG. 2, when a magnetic field is generated between an upper magnetic pole and another magnetic pole by a magnetizing coil A, the magnetic field distribution of the same will be as indicated by (A) in FIG. 3. Meanwhile, when a magnetic field is generated between magnetic poles under the sample by a magnetizing coil B, the magnetic field distribution of the same will be as indicated by (B). When the respective magnetizing currents are reversed with the strength of the magnetizing coils A and B set such that the tails of the magnetic field distributions (A) and (B) generally agree with each other in strength, the distributions (A) and (B) are synthesized into a distribution (C). Since the spread of the distribution tail (spread toward the electron source) is significantly suppressed in the magnetic field distribution (C), a very short focal length is achieved while reserving some distance between the upper magnetic pole and the sample (while reserving an operating distance for the sample or a sufficient space for providing a sample moving mechanism).

Although magnetic field strength required for focusing may not be obtained with the synthesized magnetic field distribution (C) when the acceleration voltage is increased, the required magnetization strength can be achieved in this case by setting the current ratio between the magnetizing coils A and B such that the strength of the magnetic field distribution (B) is slightly reduced. While this makes the focal distance slightly longer to increase chromatic aberration, the reduction in resolution due to the increase in chromatic aberration is negligible because chromatic aberration contributes less to resolution at a high acceleration voltage. While an increase in the focal length results in an increase in the spherical aberration coefficient, no practical problem occurs even if the spherical aberration coefficient is increased to some extent because resolution is reduced only at a factor of the quadruple root of the spherical aberration coefficient.

In addition, it is possible to detect a signal that provides desired contrast efficiently without decreasing the operating distance by providing a secondary electron acceleration electrode, a secondary electron conversion electrode (for detecting an electron signal backscattered at low acceleration), orthogonal electromagnetic field generating means (for detecting secondary electrons efficiently) and a backscattered electron detector (for detecting an electron signal backscattered at high acceleration) closer to the electron source than the objective lens in order to detect secondary electrons and backscattered electrons selectively and efficiently.

As described above, present invention makes it possible to reserve a distance required to move a sample and to provide a moving mechanism while achieving a short focal length and, in addition, to achieve display of an image at a high resolution and preferable contrast with an operating distance reserved to allow a sample to be tilted because a signal which contributes to the desired contrast can be detected selectively and efficiently.

BEST MODE FOR CARRYING OUT THE INVENTION

Figure 1:
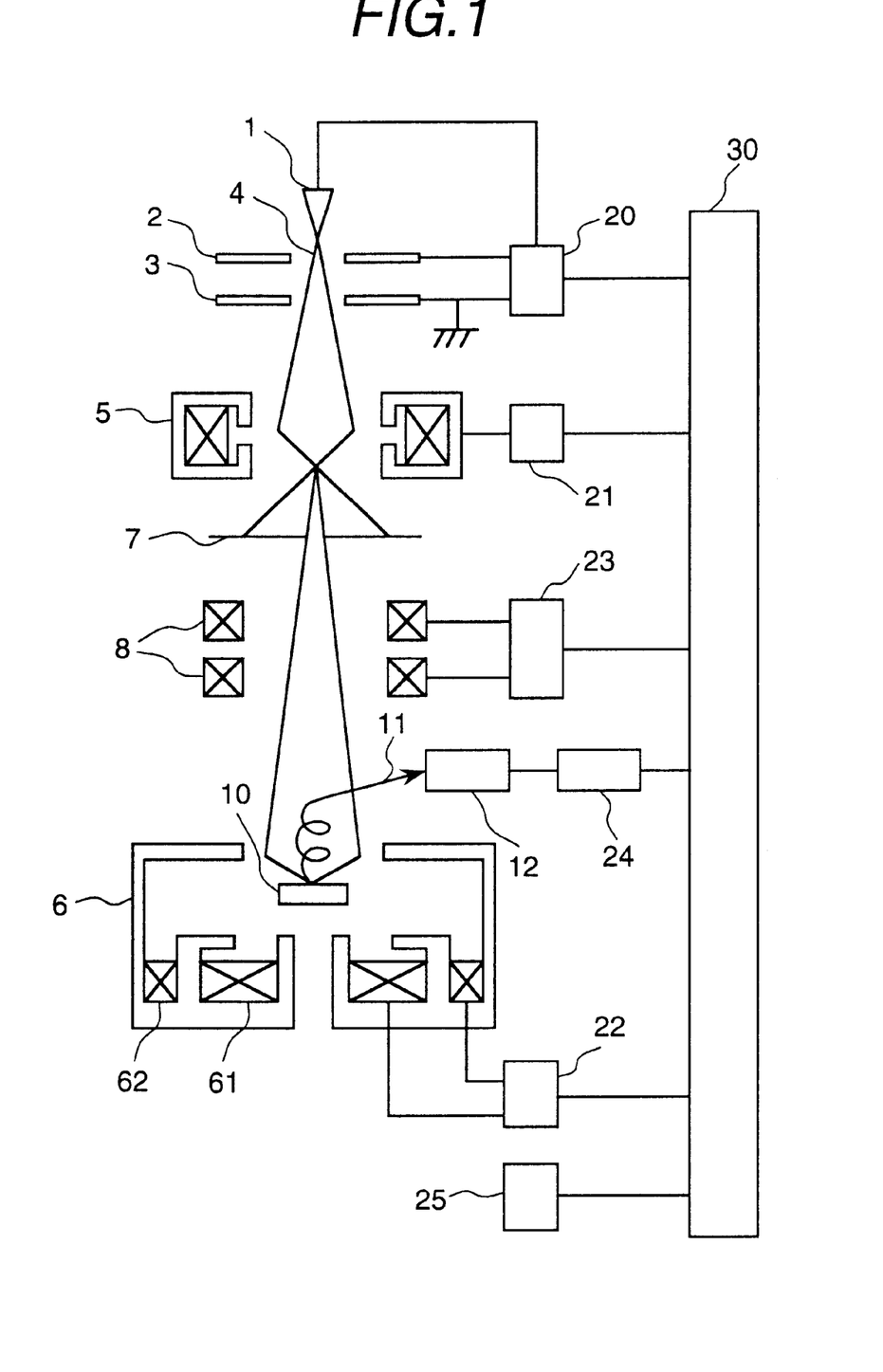
FIG. 1 illustrates an example of the application of the present invention to a scanning electronic microscope.

FIG. 1 is a schematic sectional view of an embodiment of the present invention. A voltage is applied between a cathode 1 and a first anode 2 by a high voltage control power supply 20 controlled by a microprocessor (CPU) 30 to obtain a predetermined emission current from the cathode. Since an acceleration voltage is applied between the cathode 1 and a second anode 3 by the high voltage control power supply 20 controlled by the CPU 30, primary electron beams 4 emitted by the cathode 1 are accelerated and directed to a lens system downstream thereof. The primary electron beams 4 are converged by a convergent lens 5 controlled by a lens control power supply 21, applied to an aperture stop plate 7 where unnecessary regions of the primary electron beams are eliminated and converged by an objective lens 6 into a microscopic spot on a sample 10. The primary electron beams 4 are two-dimensionally scanned on the sample by a scanning coil 8, and a secondary signal 11 generated at the sample at this time is detected by a secondary signal detector 12 and is stored in an image memory 24 as an image signal. The image information stored in the image memory 24 is displayed on an image display 25 when needed. A scan signal from the scanning coil 8 is controlled by a scanning coil control power supply 23 depending on the magnification factor for observation.

The objective lens 6 is formed by three magnetic poles shown in FIG. 2, and magnetic fields generated between the magnetic poles are controlled by magnetizing coils 61 and 62. Currents flowing through the magnetizing coils 61 and 62 are controlled by an objective lens control power supply 22 such that they are maintained at directions and a current ratio which are set in advance. The ratio between the currents through the magnetizing coils 61 and 62 is programmed in advance in the control CPU such that an acceleration voltage is set at a different value in each of predetermined ranges. The ratio between the currents through the magnetizing coils 61 and 62 is set such that the tail of the magnetic field of the objective lens is shortest when the acceleration voltage is lower than a predetermined value and such that primary electron beams at the maximum acceleration voltage used can be focused when the acceleration voltage is higher than the predetermined value. Such a ratio between the currents through the magnetizing coils 61 and 62 is determined in advance based on the result of a simulation or experiment. As a result, when the acceleration voltage is low, the focal length is set at the shortest condition to achieve the highest resolution. When the acceleration voltage is higher, the magnetic filed distribution of the objective lens is adjusted to enhance the beam focusing capability accordingly. This makes it possible to maintain conditions for high resolution in a wide range of acceleration voltage.

Further, the sample shown in FIG. 2 is held on a side entry stage which is not shown. The side entry stage is a stage having a sample supported thereon which is inserted into the electronic microscope from the outside to locate the sample in a position where it is irradiated with electron beams. In the present embodiment, the use of the present invention makes it possible to reserve an area required to tilt the sample between the bottom surface of the upper magnetic pole and the top surface of the lower magnetic pole in the in-lens type objective lens with a short focal point maintained.

An effect of reserving a sufficient space for providing a sample stage or sample moving mechanism can be achieved in an apparatus having a sample holding mechanism of a type in which a sample stage is placed on a floor instead of a side entry stage. This is also advantageous from the viewpoint of anti-vibration properties in this case because the sample stage is provided in the objective lens (e.g., on the tope surface of the lower magnetic pole).

The present invention further makes it possible to achieve an excellent effect from the viewpoint of the efficiency of detecting secondary signals such as secondary electrons and backscattered electrons. In general, a secondary signal detector is provided above an objective lens. Specifically, in the case of the objective lens shown in FIG. 2, a secondary signal detector is provided above the upper magnetic pole. While secondary signals emitted from a sample pass through an electron beam aperture formed by the upper magnetic pole, if the aperture is small, the secondary signals can collide with the objective lens, making it impossible to detect a sufficient number of secondary signals. On the other hand, expansion of this aperture results in an increase in leakage magnetic fields closer to the electron source, which makes it impossible to converge electron beams at a short focal point. That is, chromatic aberration is increased.

In the present embodiment, since the magnetizing coil B provided under the sample generates a magnetic field that suppresses leakage magnetic fields closer to the electron source, electron beams can be converged at a short focal point even if a somewhat large aperture is provided.

Figure 7:
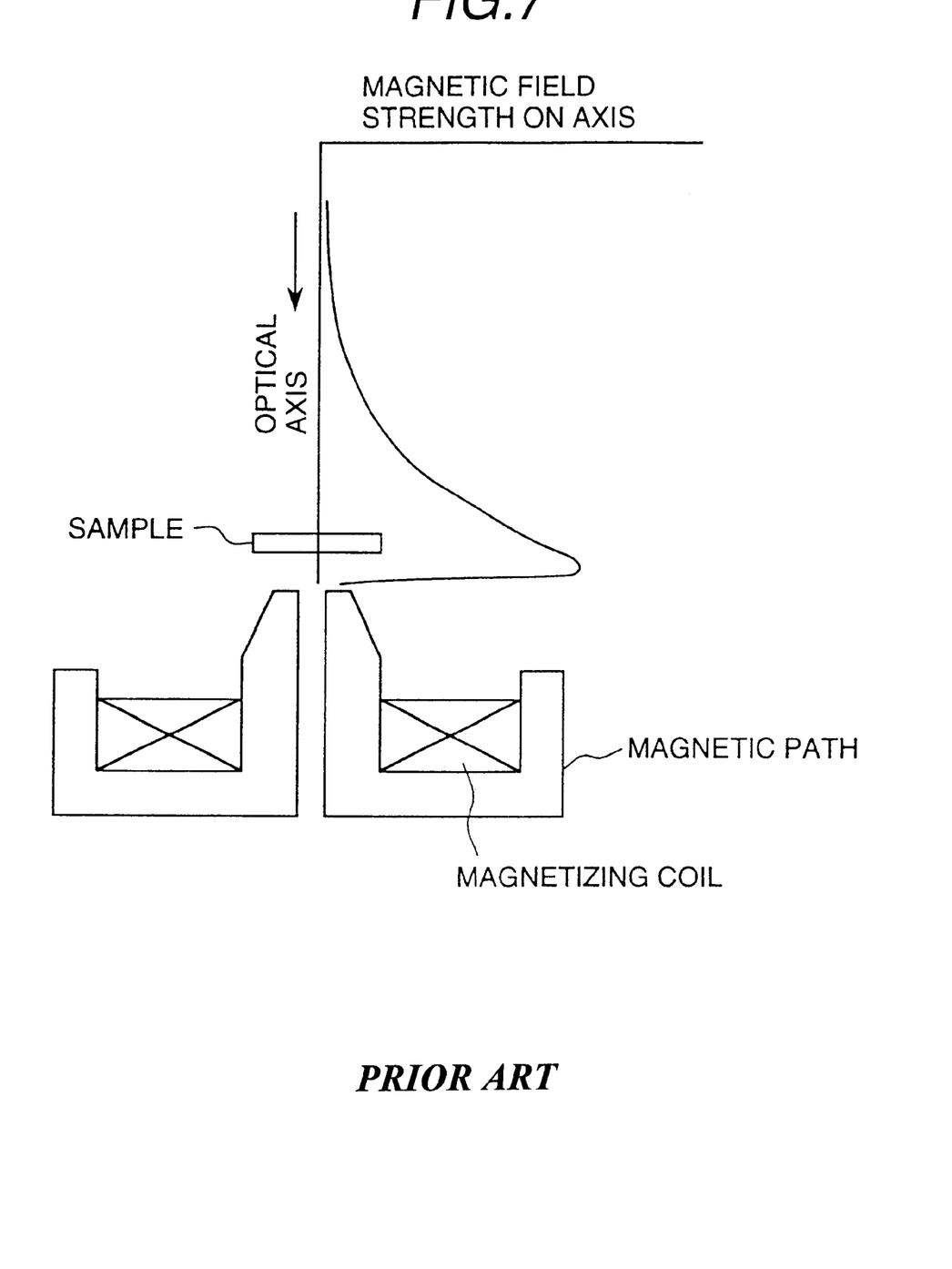
FIG. 7 illustrates a snorkel type objective lens and the distribution of a magnetic field generated by the lens.

Further, a snorkel type objective lens as shown in FIG. 7 has a long tail extending toward the electron source. Therefore, in order to achieve a short focal length, primary electron beams must be focused at the tail portion in the magnetic field distribution. Since the magnetic field strength at the tail portion of the magnetic field distribution is very low, very high magnetizing conditions are required to achieve desired performance, which limits the usable operational range to an extremely low acceleration voltage (e.g., 1 kV or less). On the contrary, the in-lens type objective lens according to the present invention can converge primary electron beams at a short focal point even at a high acceleration voltage because the magnetic field strength at the tail portion can be increased. That is, high acceleration voltages can be accommodated.

Conventional snorkel type objective lenses and in-lens type objective lenses have faced a practical limit at a chromatic aberration coefficient or spherical aberration coefficient in the range from about 2 mm to about 3 mm and, for example, it has been difficult to achieve an aberration coefficient of 2 mm or less.

According to the embodiment of the present invention, in an in-lens type objective lens in which it has been difficult to achieve an aberration coefficient as described above because an area for tilting a sample or an area to form a sample stage is provided, it is possible to achieve an aberration coefficient of 2 mm or less with an area as described above reserved.

Figure 4:
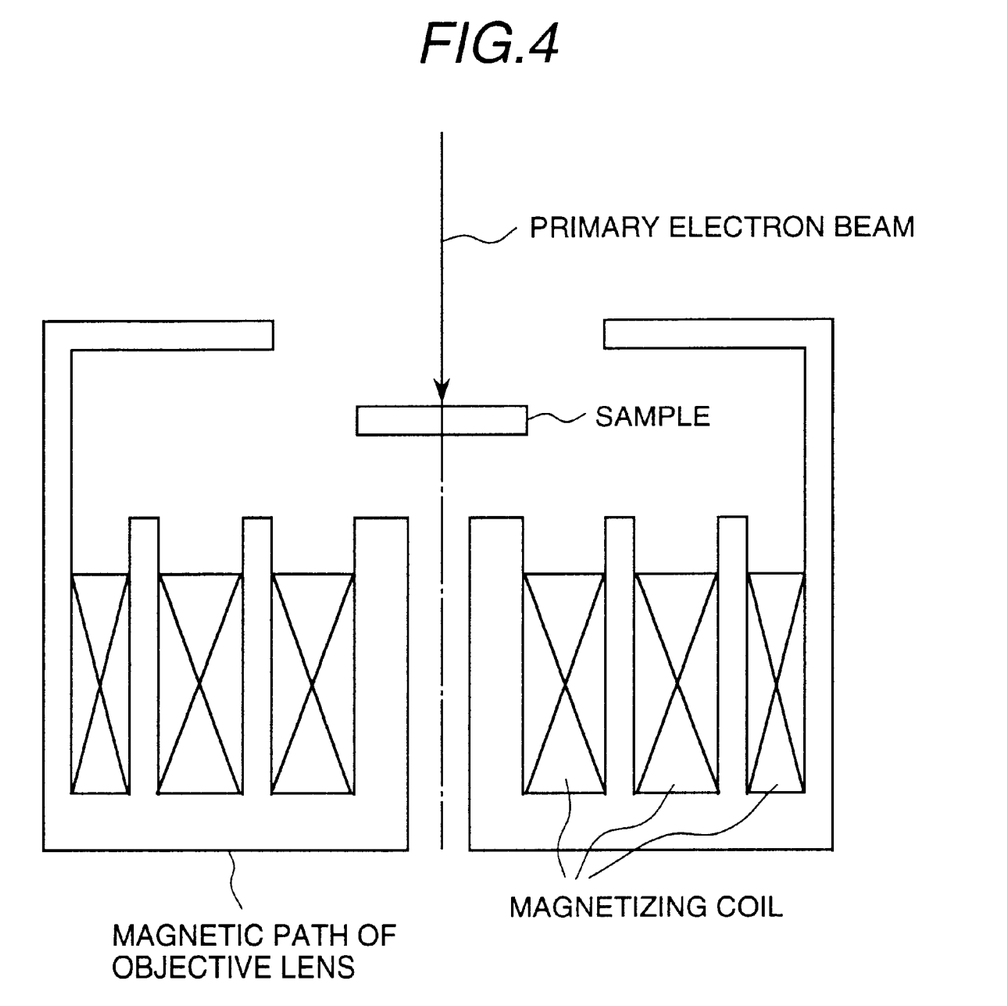
FIG. 4 shows another configuration of the objective lens.

FIG. 4 shows another embodiment of an objective lens portion according to the present invention. In this figure, an objective lens is formed by four magnetic poles, and three of the magnetic poles are provided under a sample. Independent magnetizing coils are provided between the magnetic poles. Since the increase in the number of the magnetic poles under a sample as shown in FIG. 4 makes it possible to adjust the shape of the distribution of a synthesized magnetic field more finely, a lens magnetic field which is more suitable for a short focal point can be generated by setting the ratio between the magnetizing currents through the coils and the directions of the currents properly.

Figure 5:
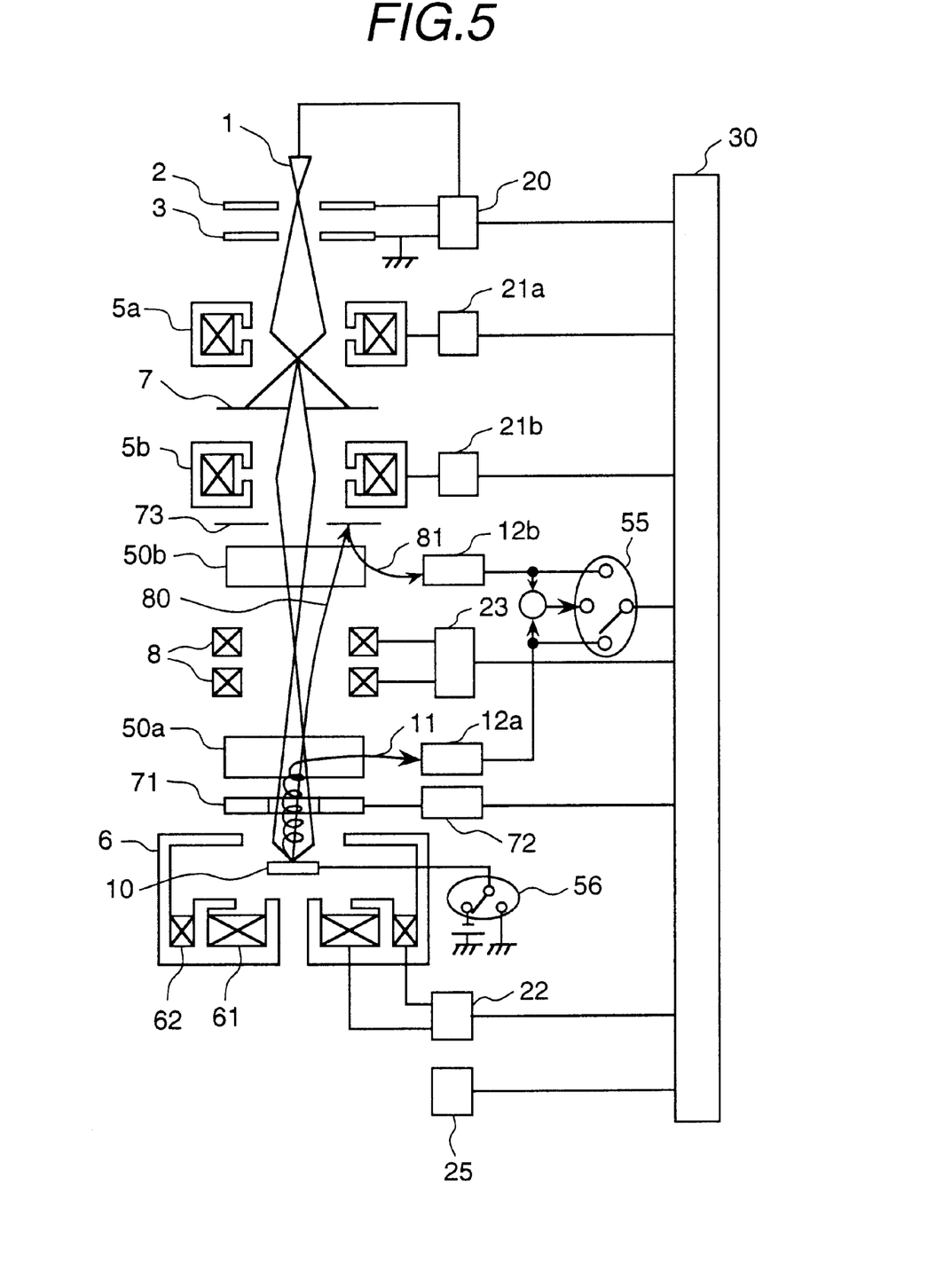
FIG. 5 shows another embodiment of the present invention.

FIG. 5 is a schematic sectional view of another embodiment of the present invention. A sample 10 is insulated from an earth potential and is adapted such that it can be set to either the earth potential or a negative potential with a select switch 56. At the upper magnetic pole portion of the objective lens, a backscattered electron detector 71, orthogonal electromagnetic field generators (hereinafter referred to as EXBs) 50a and 50b for deflecting secondary electrons having low energy toward detectors 12a and 12b and a secondary electron conversion electrode 73 for converting electrons having high energy into secondary electrons having low energy are arranged in the order of decreasing distance to the electron source. The backscattered electron detector 71 is constructed such that it can be inserted into and removed from vacuum, and the detector can be moved away from the optical axis of primary electron beams where it is not required. Signal outputs from the detectors 12a and 12b can be separately extracted with a select switch 55 or extracted after synthesizing them through addition.

When a sample is set at a negative potential by the select switch 56, resolution is improved by a retarding effect. In this case, since secondary electrons generated by the sample are also accelerated by the negative potential applied to the sample, they can not be sufficiently deflected toward the detector 12a by the EXB 50a. At this time, the secondary electrons generated by the sample move upward toward the electron source along with backscattered electrons to collide with the secondary electron conversion electrode 73. The electrode 73 has a surface formed from a material which is likely to generate secondary electrons when irradiated with electron beams (e.g., gold) and generates new secondary electrons 81 when accelerated secondary electrons or backscattered electrons collide therewith. The secondary electrons are deflected by the EXB 50b toward the detector 12b because they are having low energy and are detected by the detector 12b. The secondary electrons detected by the detector 12b provide information that reflects the structure of the sample because they originate from signals generated at the sample. When the acceleration voltage is high or the voltage applied to the sample (retarding voltage) is as high as, for example, 5 kV or more, the amount of the secondary electrons emitted by the secondary electron conversion electrode 73 is reduced in general. This is because the efficiency of the generation of secondary electrons from a metal generally peaks in the vicinity of 1 kV of energy of the incoming electrons. In such a case, the signal can be efficiently detected by the backscattered electron detector 71. The backscattered electron detector 71 is constituted by a scintillator or semiconductor which generally provides higher detecting efficiency as the acceleration voltage is increased.

On the other hand, when the sample is set at the earth potential, secondary electrons generated at the sample are deflected by the EXB 50a and are detected by the detector 12a. Backscattered electrons having high energy collide with the secondary electron conversion electrode 73 to generate secondary electrons, and the secondary electrons are deflected by the EXB 50b and detected by the detector 12b. Those signals can separately taken in with the select switch 55 or taken in after synthesizing them through addition as needed. By selectively taking in a required signal in such a manner, optimum contrast can be achieved depending on the sample. When the efficiency of secondary electron conversion at the secondary electron conversion electrode 73 is reduced by a high acceleration voltage, the backscattered electron detector 71 detects a backscattered electron signal.

Figure 6:
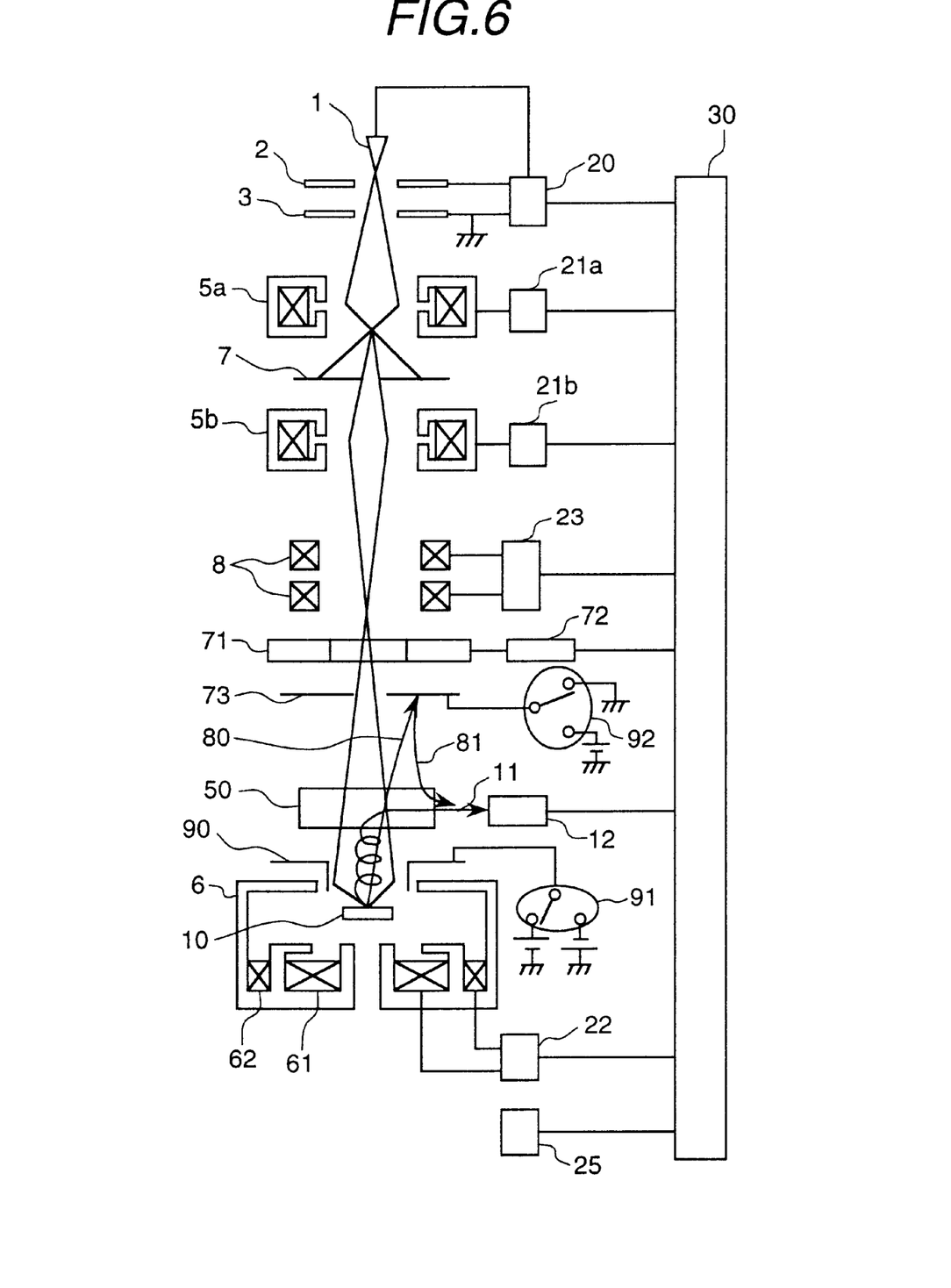
FIG. 6 shows still another embodiment of the present invention.

FIG. 6 shows another example of a configuration according to the present invention. In the configuration shown in FIG. 6, a secondary electron acceleration electrode 90 is provided at the upper magnetic pole portion of the objective lens, and a select switch 91 allows positive and negative voltages to be applied on a switched basis. An EXB 50, a secondary electron conversion electrode 73 and a backscattered electron detector 71 are provided closer to the electron source than the secondary electron acceleration electrode 90. The secondary electron conversion electrode 73 is constructed such that it can be inserted into and removed from vacuum and is capable of causing backscattered electrons 80 generated at a sample 10 to collide with the secondary electron conversion electrode 73 or backscattered electron detector 71. Further, a positive voltage can be applied to the secondary electron conversion electrode 73 with a switch 92.

Secondary electrons 11 or backscattered electrons 80 generated at a sample in the detector are selectively detected depending on the combination of the switches 91 and 92. For example, when a negative voltage is applied to the secondary electron acceleration electrode 90 and the secondary electron conversion electrode 73 is set at the earth potential, secondary electrons generated at a sample can not travel toward the EXB 50 because of the negative voltage at the secondary electron acceleration electrode 90, and only backscattered electrons 80 having high energy move upward to collide with the secondary electron conversion electrode 73. Secondary electrons generated as a result of the collision are deflected by the EXB 50 and detected by a detector 12. In this case, therefore, only the backscattered electrons generated at the sample can be detected. Selection of signals in such a manner is advantageous especially for observation under circumstances where samples are charged. The reason is that secondary electrons having low energy can provide abnormal contrast information because of the charge at the sample and the information is rather unnecessary for stable observation of an image. When positive voltages are applied to the secondary electron acceleration electrode 90 and secondary electron conversion electrode 73, the secondary electrons 11 generated at the sample travel to the EXB 50 to be deflected and are detected by the detector 12. The backscattered electrons 80 generated at the sample collide with the secondary electron conversion electrode 73 to generate secondary electrons, and the secondary electrons can not travel to the EXB 50 and are not therefore detected because a positive voltage is applied to the secondary electron conversion electrode 73. In this case, therefore, only the secondary electrons 11 are detected by the detector 12. Similarly, when a positive voltage is applied to the secondary electron acceleration electrode 90 and the secondary electron conversion electrode 73 is set at the earth potential, both of the secondary electrons 11 and backscattered electrons 80 are detected by the detector 12.

When the amount of secondary electrons emitted by the secondary electron conversion electrode 73 is reduced by a high acceleration voltage, backscattered electrons can be detected at high efficiency by the backscattered electron detector 71 by moving the secondary electron conversion electrode 73 away from the optical axis.

As described above, the present invention makes it possible to achieve a very high resolution with the freedom of moving (e.g., tilting) a sample reserved because a very short focal length can be achieved with the required operating distance reserved. In addition, since the distribution of a lens magnetic field can be properly changed depending on the acceleration voltage, it is possible to focus primary electron beams on a sample in a wide range of acceleration voltage and to maintain a high resolution. Moreover, since secondary electrons and backscattered electrons can be efficiently and selectively detected and can be thereafter separated or synthesized as needed, an image of a sample can be displayed under optimum contrast conditions.

What is claimed is:

1. A charged particle beam irradiator wherein charged particle beams emitted by a charged particle source are scanned on a sample and wherein a scanned image of said sample is obtained based on charged particles obtained by said scanning, comprising:
   an electromagnetic lens which includes:
      a first magnetic pole provided between said sample and said charged particle source; and
      second and third magnetic poles provided under said sample and configured to generate a magnetic field which is formed by a gap between said second and third magnetic poles and limits a focusing magnetic field formed between said first magnetic pole and said second and third magnetic poles.

2. A charged particle beam irradiator according to claim 1, wherein a magnetic field generated between the pair of magnetic poles provided under the sample has an effect of suppressing a magnetic field generated between said first magnetic pole provided between the sample and said charged particle source and said second and third magnetic poles provided under the sample.

3. A charged particle beam irradiator according to claim 1, comprising magnetizing coils provided between said first, second and third magnetic poles, said magnetizing coils being equipped with a control power supply for controlling a current applied thereto.

4. A charged particle beam irradiator according to claim 1, said electromagnetic lens being equipped with at least two magnetizing coils; one of said magnetizing coils being provided between said first magnetic pole provided between the sample and the charged particle source and said second and third magnetic poles provided under the sample; and the other of said magnetizing coils being provided between said second magnetic pole and said third magnetic pole provided under the sample.

5. A charged particle beam irradiator according to claim 1, said electromagnetic lens being equipped with at least two magnetizing coils; at least one of said magnetizing coils generates a first magnetic field to converge said charged particle beams between said first magnetic pole provided between the sample and the charged particle source and said second and third magnetic poles provided under the sample; and the other of said magnetizing coils generates a magnetic field between said second and third magnetic poles provided under the sample to suppress said first magnetic field.

6. A charged particle beam irradiator according to claim 1, said electromagnetic lens being equipped with at least two magnetizing coils; at least one of said magnetizing coils generates a first magnetic field to converge said charged particle beams between said first magnetic pole provided between the sample and the charged particle source and said second and third magnetic poles provided under the sample; and the other of said magnetizing coils generates a magnetic field between said second and third magnetic poles provided under the sample to suppress a tail portion of the magnetic field distribution formed by said first magnetic field.

7. A charged particle beam irradiator according to claim 1, comprising a control portion for varying a ratio between a strength of a magnetic field generated between said first magnetic pole provided between the sample and said charged particle source and at least one of said second and third magnetic poles and a strength of a magnetic field generated between said second and third magnetic poles provided under the sample depending on a magnitude of an acceleration voltage for said charged particle beams.

8. A charged particle beam irradiator according to claim 7, said control portion controls such that said charged particle beams are converged more intensely as said acceleration voltage is increased.

9. A charged particle beam irradiator according to claim 1, comprising a secondary signal detector provided above said first magnetic pole provided between the sample and the charged particle source.

10. A charged particle beam irradiator according to claim 9, comprising an electrode for generating secondary electrons as a result of a collision of said secondary signals provided on said secondary signal detector.

11. A charged particle beam irradiator according to claim 9, said secondary signal detector comprises means for generating an electrical field and a magnetic field orthogonal to said charged particle beams (orthogonal electromagnetic field generating means) and in that said electrical field and magnetic field are adjusted to deflect said secondary signal toward the secondary signal detector.

12. A charged particle beam irradiator according to claim 9, said secondary signal detector being a backscattered electron detector and in that said backscattered electron detector comprises a moving mechanism for movement in the direction of the optical axis of said charged particle beams or in a direction perpendicular to said optical axis.

13. A charged particle beam irradiator according to claim 9, at least two units of said secondary signal detector are provided and display means for displaying output signals from said two secondary signal detectors on a switched basis or after synthesizing the output signals through addition.

14. A charged particle beam irradiator according to claim 1, comprising means for applying a negative voltage to said sample.

15. A charged particle beam irradiator according to claim 1, comprising a movable sample table on which said sample is placed, the movable sample table formed on a member that forms said objective lens.

16. A charged particle beam irradiator according to claim 15, said sample table having a tilting function.

17. A charged particle bam irradiator according to claim 15, said sample table being of a side entry type for inserting and removing a sample in and from vacuum.

18. A charged particle beam irradiator wherein charged particle beams from a charged particle source are converged by an objective lens to irradiate a sample, said objective lens comprising at least a first pair of magnetic poles provided so as to sandwich said sample and at least a second pair of magnetic poles provided under said sample having a gap which is open to said charged particle source.

19. A charged particle beam irradiator wherein charged particle beams from a charged particle source are converged by a convergent lens to irradiate a sample, said convergent lens comprising means to generate at least a first magnetic field having an effect of converging said charged particle beams and a second magnetic field for suppressing the converging effect of said first magnetic field.

20. A charged particle beam irradiator wherein charged particle beam emitted by a charged particle source is scanned on a sample and wherein a scanned image of said sample is obtained based on charged particles obtained by said scanning, comprising:

an electromagnetic lens which includes:

a first magnetic pole, having an opening, provided between the sample and said charged particles source; and         a pair of magnetic poles provided under said sample with a gap that is opened toward said opening of said magnetic pole formed therebetween,         a focusing magnetic field being formed between said magnetic pole and said pair of magnetic poles, and         a magnetic field being generated in said gap between said pair of magnetic poles, said magnetic field limiting said focusing magnetic field.

\* \* \* \* \*